US011127715B2

(12) United States Patent
Andry et al.

(10) Patent No.: US 11,127,715 B2
(45) Date of Patent: Sep. 21, 2021

(54) LARGE CHANNEL INTERCONNECTS WITH THROUGH SILICON VIAS (TSVS) AND METHOD FOR CONSTRUCTING THE SAME

(71) Applicant: INTERNATIONAL BUSINESS MACHINES CORPORATION, Armonk, NY (US)

(72) Inventors: Paul S. Andry, Yorktown Heights, NY (US); Mark D. Schultz, Ossining, NY (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 16/238,803

(22) Filed: Jan. 3, 2019

(65) Prior Publication Data

US 2019/0139938 A1 May 9, 2019

Related U.S. Application Data

(62) Division of application No. 14/610,416, filed on Jan. 30, 2015, now Pat. No. 10,177,116.
(Continued)

(51) Int. Cl.
*H01L 25/065* (2006.01)
*H01L 25/00* (2006.01)
(Continued)

(52) U.S. Cl.
CPC ........ *H01L 25/0657* (2013.01); *H01L 23/473* (2013.01); *H01L 24/94* (2013.01);
(Continued)

(58) Field of Classification Search
CPC .................. H01L 25/0657; H01L 2225/06589
See application file for complete search history.

(56) References Cited

U.S. PATENT DOCUMENTS 7,180,742 B1   2/2007   Chayut
7,592,697 B2   9/2009   Arana et al.
(Continued)

OTHER PUBLICATIONS

List of IBM Patents or Patent Applications Treated as Related dated Jan. 3, 2019, 2 pages.

*Primary Examiner* — Thao X Le
*Assistant Examiner* — Laura M Dykes
(74) *Attorney, Agent, or Firm* — Tutunjian & Bitetto, P.C.; Daniel Morris

(57) ABSTRACT

An electrical device that includes at least two active wafers having at least one through silicon via, and at least one unitary electrical communication and spacer structure present between a set of adjacently stacked active wafers of the at least two active wafers. The unitary electrical communication and spacer structure including an electrically conductive material core providing electrical communication to the at least one through silicon via structure in the set of adjacently stacked active wafers and a substrate material outer layer. The at least one unitary electrical communication and spacer structure being separate from and engaged to the adjacently stacked active wafers, wherein coolant passages are defined between surfaces of the adjacently stacked active wafers and the at least one unitary electrical communication and spacer structure.

18 Claims, 7 Drawing Sheets

Related U.S. Application Data

(60) Provisional application No. 61/936,059, filed on Feb. 5, 2014.

(51) Int. Cl.
    *H01L 23/473*    (2006.01)
    *H01L 23/00*    (2006.01)
    *H01L 23/48*    (2006.01)

(52) U.S. Cl.
    CPC ............ *H01L 25/50* (2013.01); *H01L 23/481* (2013.01); *H01L 24/16* (2013.01); *H01L 24/32* (2013.01); *H01L 24/73* (2013.01); *H01L 24/81* (2013.01); *H01L 2224/131* (2013.01); *H01L 2224/16146* (2013.01); *H01L 2224/291* (2013.01); *H01L 2224/32225* (2013.01); *H01L 2224/73203* (2013.01); *H01L 2224/81005* (2013.01); *H01L 2224/94* (2013.01); *H01L 2225/06513* (2013.01); *H01L 2225/06541* (2013.01); *H01L 2225/06589* (2013.01); *H01L 2924/0002* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01); *H01L 2924/1305* (2013.01); *H01L 2924/1431* (2013.01); *H01L 2924/1434* (2013.01); *H01L 2924/1435* (2013.01); *H01L 2924/1436* (2013.01); *H01L 2924/1438* (2013.01)

(56) References Cited

U.S. PATENT DOCUMENTS

| | | |
|---|---|---|
| 8,363,402 B2 | 1/2013 | Brunschwiler et al. |
| 8,451,609 B2 | 5/2013 | Olesen et al. |
| 2005/0269665 A1 | 12/2005 | Wylie et al. |
| 2006/0220261 A1* | 10/2006 | Egawa .................... H01L 24/94 257/778 |
| 2010/0290188 A1 | 11/2010 | Brunschwiler et al. |
| 2011/0042820 A1* | 2/2011 | Knickerbocker ........................... H01L 21/76898 257/774 |
| 2012/0013022 A1* | 1/2012 | Sabuncuoglu Tezcan ................... H01L 23/481 257/774 |
| 2012/0032326 A1* | 2/2012 | Kim ...................... H01L 23/147 257/738 |
| 2012/0061059 A1 | 3/2012 | Hsiao et al. |
| 2012/0063090 A1 | 3/2012 | Hsiao et al. |
| 2013/0003301 A1 | 1/2013 | Miyamoto et al. |
| 2013/0044431 A1 | 2/2013 | Koeneman |
| 2014/0015119 A1* | 1/2014 | Bonkohara ......... H01L 25/0657 257/713 |
| 2014/0017852 A1* | 1/2014 | Kwon ............... H01L 23/49827 438/108 |

\* cited by examiner

LARGE CHANNEL INTERCONNECTS WITH THROUGH SILICON VIAS (TSVS) AND METHOD FOR CONSTRUCTING THE SAME

GOVERNMENT CONTRACTS

This invention was made with Government support under Contract No.: R0011-13-C-0035 awarded by Defense Advanced Research Projects Agency (DARPA). The Government has certain rights in this invention.

BACKGROUND

Technical Field

The present disclosure relates generally to semiconductor devices, and more particularly to a structure and fabrication method for large scale integration and cooling of devices.

Description of the Related Art

With standard CMOS technology coming to its limits of performance enhancements, methods to improve system performance without substantial individual device performance improvements are increasingly needed. One such method is 3D integration, which allows for much higher bandwidth communication between system components integrated into a stack than would otherwise be possible. Such short range interconnects reduce interconnect drive power. However, stacking high power devices creates difficulty in removing the heat from the devices, as the thermal resistance associated with additional layers greatly increases the temperature of high power layers buried in the stack.

One solution to this problem is pushing coolant through the stack. However, the Through Silicon Vias (TSVs) developed for the most advanced silicon process nodes limit die thickness to 50 microns or so, limiting the realizable coolant channel size. With typical large processor dies, it is not possible to push adequate coolant through such channels at reasonable pressures.

SUMMARY

In one embodiment, an electrical device, e.g., three dimensional electrical device, is provided that includes at least two active wafers having at least one through silicon via (TSV), and at least one unitary electrical communication and spacer structure present between a set of adjacently stacked active wafers of the at least two active wafers. The unitary electrical communication and spacer structure may include an electrically conductive material core providing electrical communication to the at least one through silicon via (TSV) structure in the set of adjacently stacked active wafers and a substrate, typically semiconductor outer layer. The at least one unitary electrical communication and spacer structure being separate from and engaged to the adjacently stacked active wafers. The coolant passages are defined between surfaces of the adjacently stacked active wafers and the at least one unitary electrical communication and spacer structure.

In another embodiment, an electrical device is provided that includes at least two active wafers having at least one through silicon via (TSV); and at least one unitary electrical communication and spacer structure present between a set of adjacently stacked active wafers of the at least two active wafers. The unitary electrical communication and spacer structure comprising an electrically conductive material core providing electrical communication to the at least one through silicon via (TSV) structure in the set of adjacently stacked active wafers. The at least one unitary electrical communication and spacer structure are separate from and engaged to the adjacently stacked active wafers. Coolant passages are defined between surfaces of the adjacently stacked active wafers and the at least one unitary electrical communication and spacer structure.

In another aspect of the present disclosure, a method of forming an electrical device is provided. The method for forming the electrical device may include creating a plurality of columns of unitary electrical communication and spacer structures including an electrically conductive core material attached to a handler structure, and attaching first ends of the plurality of columns to a first active wafer. In a following process step, the handler structure is released from the columns. At least a second active wafer is attached to the second ends of the plurality of columns. Channels for coolant are formed between the plurality of columns and the first active wafer and the at least the second active wafer.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
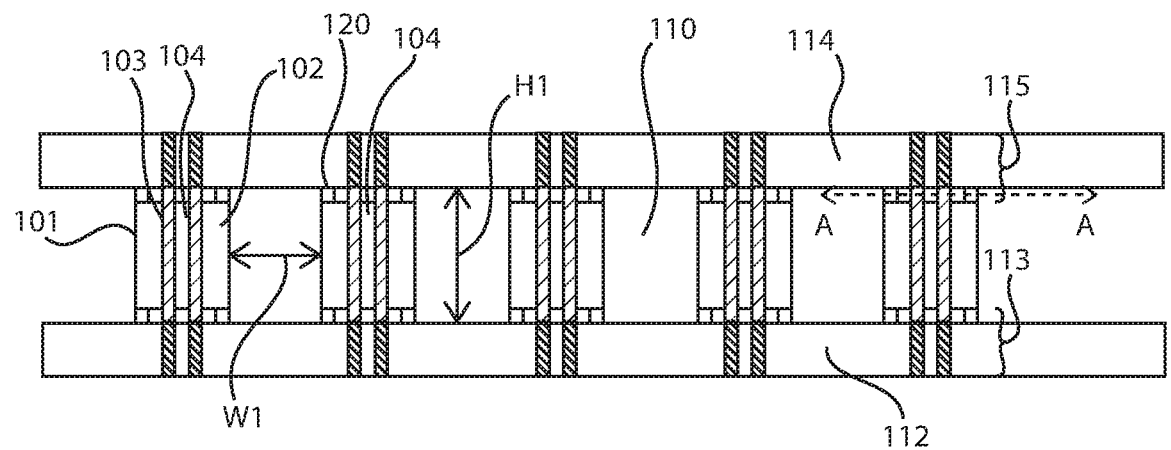
FIG. 1 is a side cross-sectional view depicting a single layer of unitary electrical communication and spacer structures between two active wafers, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements. The term "wafer" refers to a wafer, die, or substrate of any size. The term "active wafer" refers to a wafer, die, or substrate of any size which includes electronic circuit elements such as but not limited to transistors, resistors and capacitors.

An embodiment of the present disclosure includes creating a semiconductor, e.g., silicon, "wall/pin only" spacer that can incorporate fine pitch through silicon via (TSV) structures. The wall/pin spacer may hereafter be referred to as a "unitary electrical communication and spacer structure". The unitary electrical communication and spacer structure typically includes a through silicon via (TSV) structure that has been formed using a sacrificial substrate, wherein the through silicon via structure has been transferred into contact with the electrical communication features of active wafers in a three dimensional electrical device structure, i.e., an electrical device including stacked active wafers and typically including coolant passages present there through. The term "through silicon via (TSV) structure" is a vertical electrical connection (via) passing completely through a silicon wafer, substrate or die. As used herein, the term "through silicon via structure" is not intended to only be limited to silicon containing structures, as any substrate through which a via extends is suitable for providing a TSVs, including any composition of the substrate. For example, in addition to silicon containing substrates, such as silicon (Si), silicon germanium (SiGe), silicon doped with carbon (Si:C), and silicon carbide (SiC), TSV structures may be formed through other semiconductor substrates, such as other type IV semiconductors, such as germanium (Ge), and compound semiconductors, such as type III-V semiconductors, e.g., gallium arsenide (GaAs) containing semiconductor substrates. It is also contemplated that the TSV structures that are the subject of the present disclosure as well as the "unitary electrical communication and spacer structures" may also be formed through or with polymeric substrates, dielectric substrates, and glass substrates. The term "spacer" as incorporated into the term "unitary electrical communication and spacer structure" means that the unitary electrical communication and spacer structure in addition to providing for electrical communication between separate active wafers also provides a structure that defines the spacing between adjacently stacked active wafers in a manner that at least contributes to the geometry of cooling passages through.

Before bonding, the "unitary electrical communication and spacer structure" may consist of wall and/or pin structures with pads, interconnects, TSV structures, and/or features for isolating electrical interconnects from coolant, all attached to a handler structure. The spacer collection of structures, also referred to as the silicon channel structure(s) or silicon column structures, would be bonded to one die in the stack, which may or may not have corresponding channel/pin structures etched to some depth. After bonding, the handler structure would be released, leaving the collection of structures standing with a first end attached to the die. Another active die could be attached to the opposite end of the structures. The process could be repeated many times to produce a 3D stack with coolant passages for allowing coolant to circulate on both sides of a feature to be cooled. The methods and structures of the present disclosure are now discussed with more detail referring to FIGS. 1-7G.

FIG. 1 depicts one embodiment of a device structure in accordance with the present disclosure. A bottom active device wafer 112 (hereafter referred to as first active device wafer 112) is bonded to the bottom surfaces of a plurality of unitary electrical communication and spacer structures 101 comprising what may be a column like geometry having semiconductor outer layers 102 and through silicon vias (TSVs) of insulating material 103 and electrically conductive material 104. Here "semiconductor outer layers 102" refer to layers composed of whatever substrate material is used as the base for forming the unitary electrical communication and spacer structures, typically but not necessarily a semiconductor material. In referring to these outer layers, the terms "semiconductor" and "substrate material" may be used interchangeably. The electrically conductive material 104 of the TSVs may also be referred to as the "electrically conductive material core" of the unitary electrical communication and spacer structures 101 that provides the electrical communication to the at least one through silicon via (TSV) structure in the set of adjacently stacked active wafers. The tops of the unitary electrical communication and spacer structures 101 are attached to another active 3D die, or device wafer 114 (hereafter referred to a second active device wafer 114). More specifically, the top and bottom of a column of the unitary electrical communication and spacer structures 101 may be connected to an electrically conductive structure in the first active device wafer 112 and the second active device wafer 114. The electrically conductive structure of the first and second active device wafers 112, 114 that is in electrical communication with the unitary electrical communication and spacer structures 101 is typically connected by a through silicon via (TSV) 113, 115 that extends through the active device wafer, e.g., when the electrical signal carried by the unitary electrical communication and spacer structures 101 is to extend through at least one of the first and second device wafers 112, 114. For example, a first through silicon via (TSV) 113 may be present through the first active device wafer 112 that is in electrical communication, i.e., contact, with the bottom surface of the unitary electrical communication and spacer structures 101, and a second through silicon via (TSV) 115 may be present through the second active device wafer 114 that is in electrical communication, i.e., contact, with the top surface of the unitary electrical communication and spacer structures 101.

The first active device wafer 112 and/or the second active device wafer 114 may include a plurality of semiconductor devices present thereon. In some embodiments, as used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. The semiconductor devices may be switching devices, logic devices, and memory devices. Examples of switching devices and/or logic devices suitable for use with the present disclosure include p-n junction devices, bipolar junction transistors (BJT), field effect transistors, fin field effect transistors (FinFETS), Schottky barrier transistors, nanowire/nano-channel transistors and combinations thereof. As used herein, a "field effect transistor" is a transistor in which output current, i.e., source-drain current, is controlled by the voltage applied to the gate. A field effect transistor has three terminals, i.e., gate, source and drain. A "FinFET" is a semiconductor device, in which the channel of the device is present in a fin structure. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure.

The active device wafer may also include memory devices. As used herein, the term "memory device" means a structure in which the electrical state can be altered and then retained in the altered state, in this way a bit of information can be stored. The memory device may be volatile or non-volatile. Examples of memory devices suitable for use on the active device wafer include random access memory (RAM), dynamic random access memory (DRAM), embedded dynamic random access memory (EDRAM), phase change material (PCM) memory structures, FLASH memory, molecular memory and combinations thereof.

The first and/or second active device wafers 112, 114 may also include passive electrical devices, such as capacitors and resistors.

The plurality of unitary electrical communication and spacer structures 101 comprise semiconductor outer layers 102 and through silicon vias (TSVs) of insulating material 103 and conductive material 104 (the electrically conductive material core 104). The unitary electrical communication and spacer structures 101 are separate structures from the first and second active wafers 112, 114.

The electrically conductive material core 104 provides for electrical communication between at least the first device wafer 112 and the second device wafer 114. As used herein, the term "electrical communication" means that a first structure or material, e.g., conductive material 104, is electrically conductive to a second structure or material, e.g., first and second active devices wafers 112, 114 and/or devices within the first and second active device wafers 112, 114. "Electrically conductive" as used through the present disclosure can mean a material typically having a room temperature conductivity of greater than $10^{-8}$ $(-m)^{-1}$.

The electrically conductive material core 104 of the unitary electrical communication and spacer structures 101 may be in electrical contact with the TSV 113, 115 structures in the first active wafer 112 and the second active wafer 114 when electrical signal is to be carried through the first active wafer 112, and the second active wafer 114. But, in some embodiments, the electrically conductive material core 104 also provides electrical signal to the devices incorporated within the first active wafer 112, and the second active wafer 114. For example, the electrically conductive material core 104 may be in electrical communication with at least one of the semiconductor devices, memory devices, and electrical passive devices through a series of lines, such as metals lines, that are formed on or in the substrate material of the first and second active wafers 112, 114, and/or may be in electrical communication with at least one of the semiconductor devices, memory devices, and electrical passive devices that are present on the first and second active wafers 112, 114 through electrically conductive doped semiconductor portions of the substrate material of the first and second active wafers 112, 114.

The electrically conductive material core 104 may also provide or may not provide electrical communications to additional wafers, e.g., active device wafers, that are incorporated into an assembly including the first and second devices wafers 112, 114.

The electrically conductive material core 104 is typically comprised of a metal including, but not limited to W, Ni, Ti, Mo, Ta, Cu, Pt, Ag, Au, Ru, Jr, Rh, and Re, and alloys that include at least one of the aforementioned conductive elemental metals. In other embodiments, the electrically conductive material core 104 may include a doped semiconductor material, such as a doped silicon containing material, e.g., doped polysilicon. The electrically conductive material core 104 when viewed from a top down perspective may be substantially circular or oblong, or may be multi-sided.

Typically, the electrically conductive material core 104 may have a width ranging from 1000 nm to 20 microns. In other embodiments, the conductive material may have a width W1 ranging from 2 microns to 10 microns.

The insulating material 103 of the unitary electrical communication and spacer structures 101 can be a dielectric material that is formed on the sidewalls of the substrate opening that is employed to form a TSV structure, which is ultimately transferred to one of the first and second active wafers 112, 114, wherein the electrically conductive portion of the TSV structure provides the electrically conductive material core 104 of the unitary electrical communication and spacer structures 101. This insulating material 103 may be formed as part of a process that etches openings through the substrate material to provide the vias in which the TSV structures are formed, such as a result of the Bosch etch process for forming vias. In some embodiments, the insulating material 103 is an oxide of a substrate material used in forming the TSV structures. For example, the insulating material 103 may be composed of silicon oxide ($SiO_2$). In other embodiments, the insulating material 103 may be composed of silicon oxynitride. In further embodiments, the insulating material 103 may be a nitride, e.g., silicon nitride. The insulating material 103 may be present on an entirety of the sidewalls of the conductive material 104 of the TSV structures. Therefore, the insulating material 103 may separate the entirety of the electrically conductive material core 104 from the semiconductor outer layer 102 of the unitary electrical communication and spacer structure 101. Typically, the insulating material 103 may have a width ranging from 100 nm to 1 micron. In other embodiments, the insulating material 103 may have a width ranging from 500 nm to 800 nm.

Referring to FIG. 1, in some embodiments, the semiconductor outer layers 102 that are in direct contract with the insulating material 103 may provide structural support for the unitary electrical communication and spacer structure 101. The semiconductor outer layers 102 are typically composed of a substrate material. More specifically, the semiconductor outer layers 102 are typically composed of the substrate material which is used for the substrate for forming the TSV structure to be transferred in forming the unitary electrical communication and spacer structure 101. For example, the semiconductor outer layers 102 may be composed of silicon (Si), when the substrate used for forming the TSV structure is composed of silicon (Si).

Referring to FIG. 1, the assembly of the unitary electrical communication and spacer structure 101 and the first and second active wafers 112, 114 creates coolant passages 110 (hereafter referred to as coolant passages) for coolant flow, thereby allowing coolant to come into contact with the active wafers and the unitary electrical communication and spacer structures. In some embodiments, each coolant passages 110 may have a width W1 ranging from 100 microns to 400 microns. In other embodiments, each coolant passage 110 may have a width W2 ranging from 150 microns to 450 microns. In different embodiments, the width W1 may be at least 100 microns, 125 microns, 150 microns, 175 microns, 200 microns, 225 microns, 250 microns, 275 microns, 300 microns, 325 microns, 350 microns, 375 microns, 400 microns, 425 microns, 450 microns or 475 microns, or any range there between (e.g., 125 microns to 200 microns, or 175 mircons to 225 microns). In some embodiments, each channel 110 may have a height H1 ranging from 100 microns to 300 microns. In other embodiments, each channel 110 may have a height H1 ranging from 125 microns to 175 microns. In different embodiments, the height H1 may be at least 100 microns, 110 microns, 120 microns, 130 microns, 140 microns, 150 microns, 160 microns, 170 microns, 180 microns, 190 microns, 200 microns, 210 microns, 220 microns, 230 microns, 240 microns, 250 microns, 260 microns, 270 microns, 280 microns, 290 microns or 300 microns, or any range there between (e.g., 130 microns to 160 microns).

The unitary electrical communication and spacer structure 101 may be spaced to provide coolant passages 110 having a substantially similar width, or may be spaced to provide coolant passages 110 having different widths within the same level of active wafers. For example, in some embodiments, e.g, when the coolant passages are to have substantially the same width, the pitch, i.e., center to center distance between adjacent unitary electrical communication and spacer structures may range from 200 microns to 300 microns.

It is noted that although FIG. 1 only depicts 4 totally enclosed coolant passages 110 that the present disclosure is not limited to only this embodiment. Any number of coolant passages 110 for coolant can be present in an electrical structure in accordance with the present disclosure. For example, the coolant passages as provided by the present disclosure may have channels equaling 1, 2, 3, 4, 5, 10, 15, 20, 25, 30, 35, 40, 45, 50, 75 or 100. Note that the channels may be composed of spacers that create long wall structures or of much smaller structures that are effectively pins, creating in the first case a more standard channel heat sink structure and in the second case a "pin-fin" heat sink structure.

Typically, an interlevel dielectric layer is present over the active devices that are formed on the first and second active wafers 112, 114 on an upper side of the substrate, and an insulating portion of the substrate is present on the backside surface of the semiconductor devices. The interlevel dielectric layer and the insulating portion of the substrate protect the active devices, e.g., semiconductor, memory and passive electrical devices, that are present in the first and second active wafers 112, 114, from being contacted by the coolant when electrically conductive coolant is employed as the coolant medium.

Still referring to FIG. 1, in some embodiments, to protect the electrically conductive material core 104 of the unitary electrical communication and spacer structures 101 from being contacted by the coolant that flows through the coolant passages 110, seal structures 120 are provided that are positioned at least between the semiconductor outer layers 102 and the first or second active wafer 112/114 at the ends that the unitary electrical communication and spacer structures 101 is in contact with the first or second active wafer 112/114. In some embodiments, the seal structures 120 may extend into contact with the insulating material 103 of the unitary electrical communication and spacer structures 101.

The seal structures 120 are typically in contact with a portion of the first and second active wafers 112, 114 that are not electrically conductive. For example, the seal structures 120 may be in contact with a portion of the semiconductor substrate material that is not electrically conductive. In some embodiments, the seal structures 120 may be formed surrounding the entirety of the electrically conductive material core 104. The seal structures 120 may be composed of a solder used in solder bump joining methods.

In some embodiments, the seal structures 120 may be composed of a lead containing solder or lead free solder. In one embodiment, the lead-free seal structures 120 consists of Sn and at least one of Au, Pd, and Pt. The lead free seal structures 120 can be composed of a Sn—Au alloy, a Sn—Pd alloy, a Sn—Pt alloy, a Sn—Au—Pd alloy, a Sn—Au—Pt alloy, a Sn—Pd—Pt alloy, or a Sn—Au—Pd—Pt alloy. The atomic concentration of Sn is greater than 95%, and preferably greater than 97%. In some examples, the lead-free seal structures 120 may then be composed of a Sn—Au—Ag alloy, a Sn—Pd—Ag alloy, a Sn—Pt—Ag alloy, a Sn—Au—Pd—Ag alloy, a Sn—Au—Pt—Ag alloy, a Sn—Pd—Pt—Ag alloy, a Sn—Au—Pd—Pt—Ag alloy, a Sn—Au—Cu alloy, a Sn—Pd—Cu alloy, a Sn—Pt—Cu alloy, a Sn—Au—Pd—Cu alloy, a Sn—Au—Pt—Cu alloy, a Sn—Pd—Pt—Cu alloy, or a Sn—Au—Pd—Pt—Cu alloy, a Sn—Au—Ag—Cu alloy, a Sn—Pd—Ag—Cu alloy, a Sn—Pt—Ag—Cu alloy, a Sn—Au—Pd—Ag—Cu alloy, a Sn—Au—Pt—Ag—Cu alloy, a Sn—Pd—Pt—Ag—Cu alloy, a Sn—Au—Pd—Pt—Ag—Cu alloy, or any alloy comprising one of the previously listed alloys and at least another metal different from Sn, Pd, Pt, Ag, and Cu provided that the atomic concentration of Sn is greater than 95%. Preferably, the atomic concentration of Sn is greater than 97%.

It is noted that the same material that provides the seal structure 120 may also provide for an electrically conductive bond between the electrically conductive material core 104 and the TSV structures 113, 115 of the first and second active wafer 112, 114. For example, electrically conductive bond material in the form of a pad at the interface of adjoining electrically conductive core material 104 and TSV structures 113, 114 may be provided by the solder compositions described above for the sealant structures 120. As will be described below, in other embodiments including columns of a plurality of unitary electrical communication and spacer structures 101, electrically conductive bond material in the form of a pad may also be present at the interface of adjoining electrically conductive core material 104 for adjacently stacked unitary electrical communication and spacer structures 101, which may be provided by the solder compositions described above for the sealant structures 120.

In some other embodiments, the seal structures 120 may be composed of a polymeric material, such as an adhesive, an epoxy, or a polyamide material.

It is noted that the seal structures 120 are employed to isolate the electrical interconnects, i.e., electrically conductive core material 104, from coolant if non-dielectric coolant it to be used within the coolant passages 110. Non-dielectric coolants typically have a thermal conductivity of 0.3 $W \cdot m^{-1} \cdot K^{-1}$ or greater. Examples of non-dielectric coolants include Ethylene Glycol (EG), Propylene Glycol (PG), Methanol/Water, Ethanol/Water, Calcium Chloride Solution, Potassium Formate/Acetate Solution, Liquid Metals, e.g., liquid metals of Ga—In—Sn chemistry, and combinations thereof. In the embodiments, in which dielectric coolants are employed within the coolant passages 110 the seal structures 120 may be omitted. Dielectric coolants generally have a thermal conductivity of less than 0.3 $W \cdot m^{-1} \cdot K^{-1}$. Dielectric coolants that may be used within the coolant passages 110 include aromatics, such as synthetic hydrocarbons of aromatic chemistry, e.g., diethyl benzene [DEB], dibenzyl toluene, diaryl alkyl, partially hydrogenated terphenyl; silicate-esters, such as Coolanol 25R; aliphatics, such as aliphatic hydrocarbons of paraffinic and iso-paraffinic type (including mineral oils), e.g., aliphatic chemistry (polyalphaolefins or PAO); silicones, such as dimethyl- and methyl phenyl-poly (siloxane); fluorocarbons, such as fluorinated compounds, e.g., perfluorocarbons (i.e., FC-72, FC-77) hydrofluoroethers (HFE) and perfluorocarbon ethers (PFE); and combinations thereof.

Figure 2:
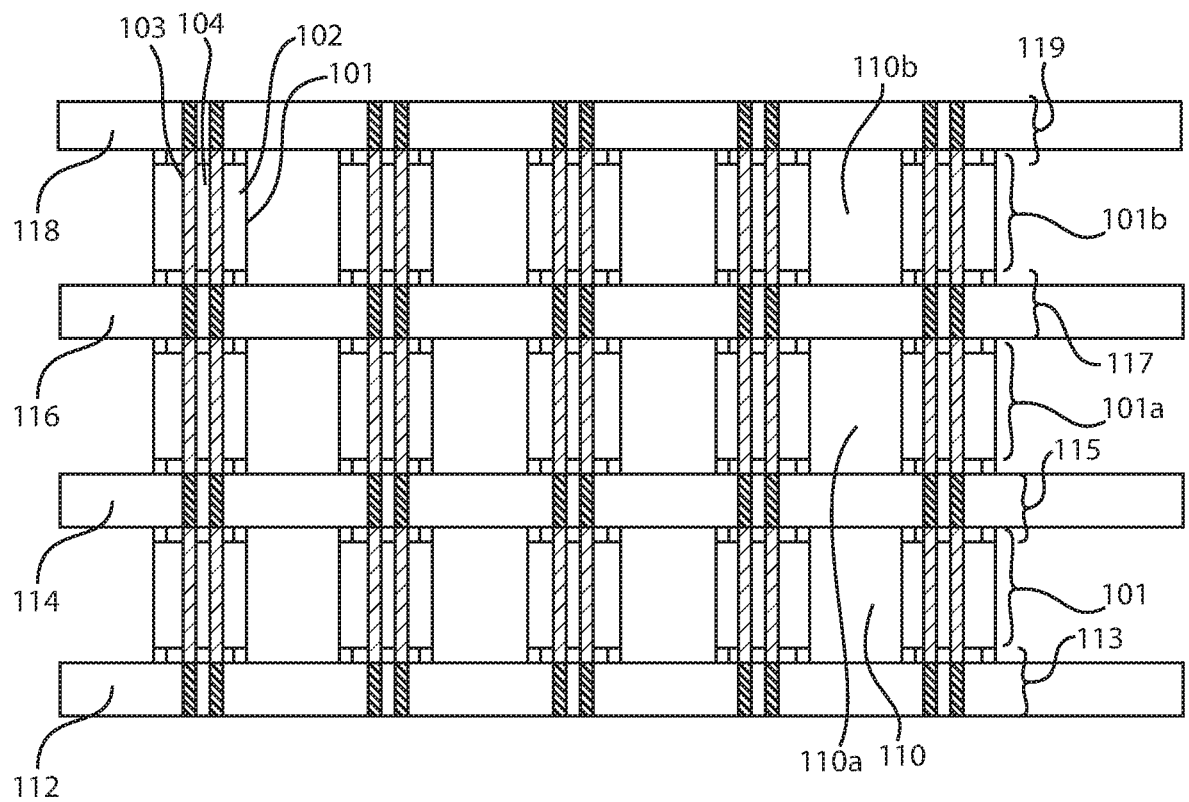
FIG. 2 is a side cross-sectional view of a multi-layer channel interconnect structure, in accordance with the present disclosure.

FIG. 2 illustrates a multi-layer device structure having an additional two active wafers identified by reference numbers 116 and 118 overlying the first and second active wafers 112, 114. The structure that is depicted in FIG. 2 may be referred to as having three spacer levels or four active levels. The additional active wafers 116, 118 are similar to the first and second active wafers 112, 114 that have been described above with reference to FIG. 1. For example, similar to the first and second active wafers 112, 114, the additional active wafers 116, 118 may each include a TSV structure 117, 119, which can bring electrical signal through each of the active wafers 116, 118 and/or be in electrical communication with devices that are present on or within the active wafers 116, 118. Therefore, the above description of the first and second wafers 112, 114 is suitable for the additional active wafers 116, 118 including the description for the composition and the types of devices, e.g., semiconductor, memory and passive electrical devices, that are present within the active wafers.

The multi-layered device structure that is depicted in FIG. 2 also includes unitary electrical communication and spacer structures 101, 101a, 101b between the stacked active wafers 112, 114, 116, 118. For example, a first set of unitary electrical communication and spacer structures 101 may be present between the first and second active wafers 112, 114 to provide a plurality of first coolant passages 101. A second set of unitary electrical communication and spacer structures 101a may be present between a second and third active wafer 114, 116 to provide a plurality of second coolant passages 101a. A third set of unitary electrical communication and spacer structures 101b may be present between a third and fourth active wafer 116, 118 to provide a plurality of third coolant passages 101b.

Each of the unitary electrical communication and spacer structures 101 are separate structures from the first, second, third, and fourth active wafers 112, 114. Each of the unitary electrical communication and spacer structures 101 include an electrically conductive core material 104, an insulating material 103, and semiconductor outer layers 102. The electrically conductive core material 104 may be in electrical communication with the TSV structures 113, 115, 117, 119 of active device wafers 112, 114, 116, 118. The electrically conductive core material 104 may be engaged to the electrically conductive features of the TSV structures 113, 115, 117, 119 by solder connection, which may be typical of solder bump processing. Further description for each of the unitary electrical communication structures 101 is provided above in the description of FIG. 1. Each of the unitary electrical communication and spacer structures 101 that are depicted in FIG. 2 may be joined to the active wafers 112, 114, 116, 118 with a seal structure 120 to seal the unitary structures to non-conductive portions of the active wafers 112, 114, 116, 118 to ensure that the coolant contained within the coolant passages 101, 101a, 101b cannot reach the electrically conductive core material 104. As with the embodiments described above with reference to FIG. 1, the seal structure 120 may be omitted.

In the FIG. 2 multi-layer structure, coolant will flow through the coolant passages 110, 110a, 110b on both the top and bottom surfaces of interior active wafers 114, 116. The coolant passages 110, 110a, 110b have a geometry defined by the sidewall surfaces of the unitary electrical communication and spacer structures 101, 101a, 101b, and the upper and lower surface of the active wafers 112, 114, 116, 118. Each of the coolant passages 110, 110a, 110b depicted in FIG. 2 may have the height H1 and width W1 of the coolant passages 110 that are described in FIG. 1. Similar to the embodiments described above with reference to FIG. 1, the multi-layered structure depicted in FIG. 2 may include any number of coolant passages.

Figure 3:
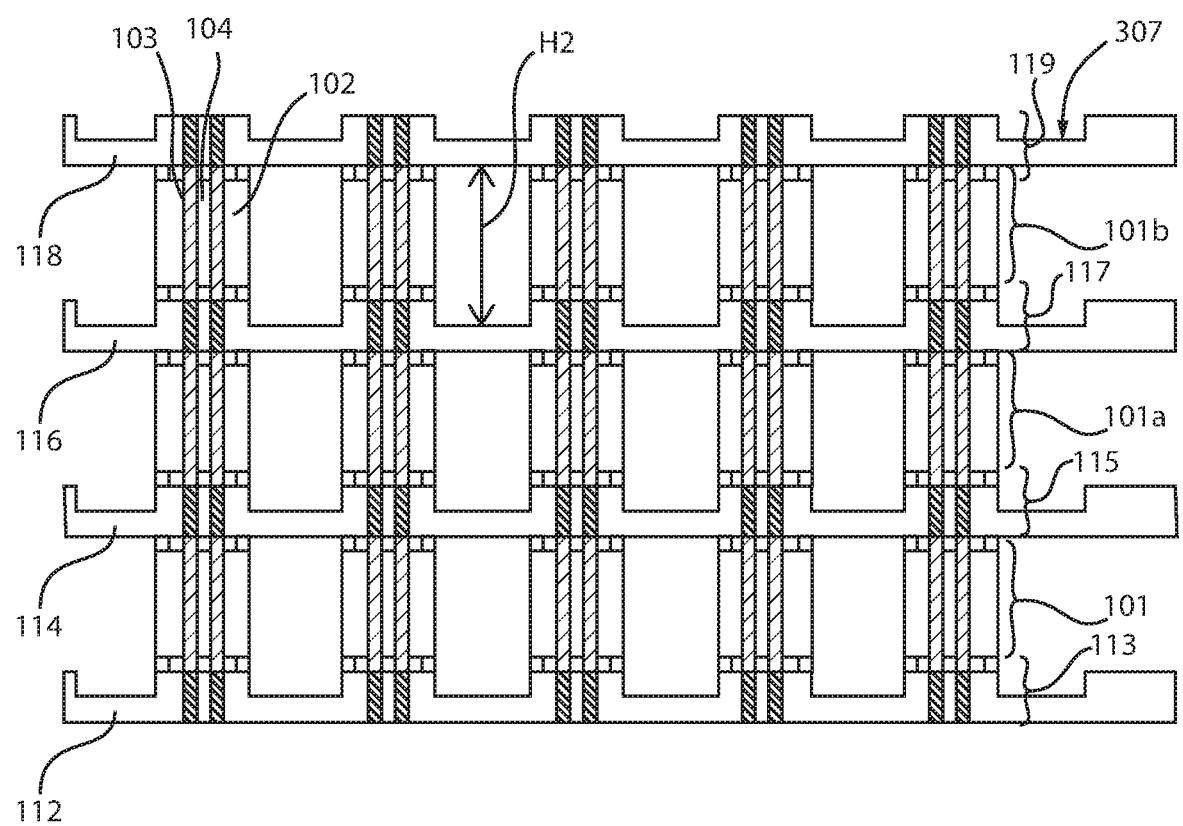
FIG. 3 is a side cross-sectional view of a multi-layer device stack structure with etched channels, in accordance with one embodiment of the present disclosure.

FIG. 3 illustrates a multi-layer device structure wherein the silicon of the active 3D device wafers is etched to form trenches 307. The multi-layer device depicted in FIG. 3 is similar to the multilayer device that is depicted in FIG. 2, which the exception that the upper surfaces of the active wafers have been etched to form the trenches 307 in the portions of the active wafers between the unitary electrical communication and spacer structures 101. Note that the trenches may be long narrow structures or may be more of a mesh-like structure if the unitary structures are of pin rather than wall form. Therefore, the description from FIG. 2 is suitable for the structure depicted in FIG. 1 of the elements having the same reference numbers in FIG. 3. When assembled, the trenches 307 increase the height of the coolant passages 110, 110a, 110b to allow a higher volume of coolant to be passed through the channels to cool the active devices. For example, the depth of the trenches 307 may range from 5 microns to 75 microns. In another example, the depth of the trenches 307 may range from 10 microns to 25 microns.

Figure 4:
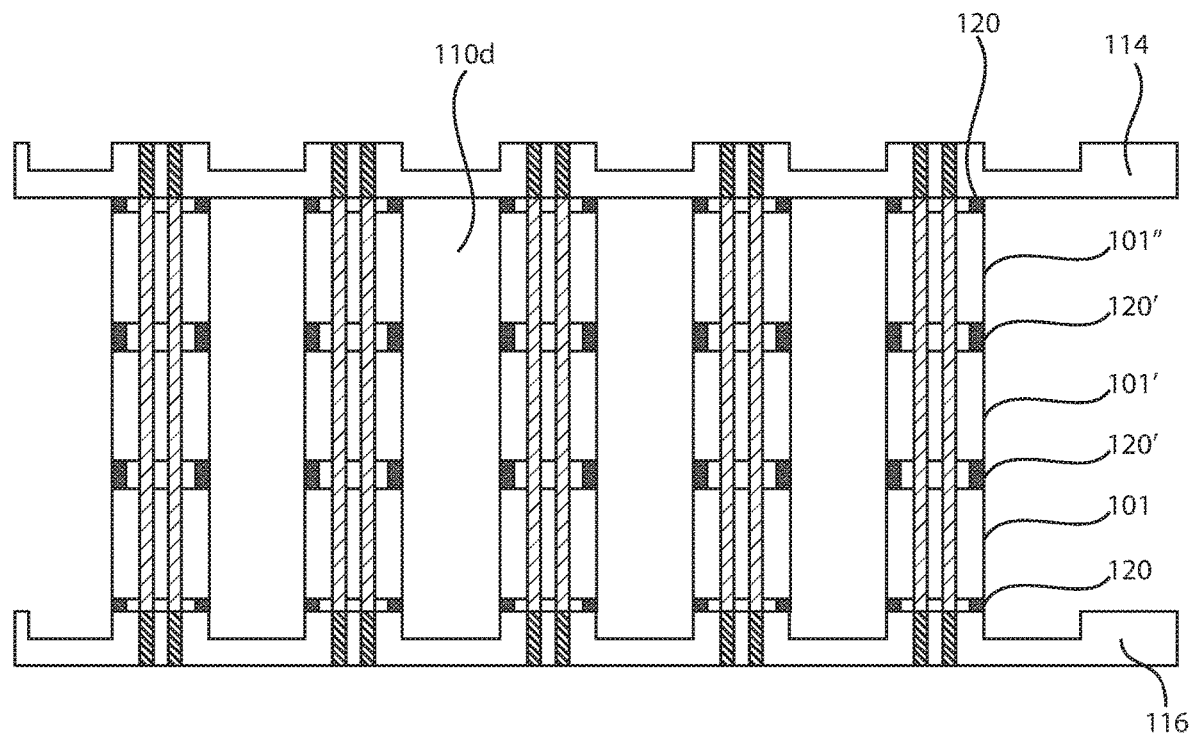
FIG. 4 is a side cross-sectional view of columns of a plurality of unitary electrical communication and spacer structures between two active wafers, in accordance with one embodiment of the present disclosure.

FIG. 4 depicts another embodiment of a multi-layered device structure, in which columns of a plurality of unitary electrical communication and spacer structures 101, 101', 101" are positioned between adjacently stacked active wafers 112, 114. The adjacently stacked active wafers 112, 114 have been described above with reference to FIGS. 1-3. Each spacer in the columns of a plurality of unitary electrical communication and spacer structures 101, 101', 101" may have a seal structure 120 bonding the outer semiconductor layer 102 of the unitary electrical communication and spacer structures and the upper and lower surfaces of the spacer structures to a non-conductive portion of the active wafers 112, 114. Seal structures 120 may also be present between adjacently stacked unitary electrical communication and spacer structures 101. The seal structures 120 can directly bonded adjacent ends of the outer semiconductor layers 102 of adjacent unitary electrical communication and spacer structures 101 together.

By stacking a plurality of unitary electrical communication and spacer structures 101, 101', 101" between adjacently stacked active wafers 112, 114, the height H2 of the coolant passages 110d may be increased. For example, in the embodiment depicted in FIG. 4, when each column of a plurality of unitary electrical communication and spacer structures 101, 101', 101" includes three unitary electrical communication and spacer structures each having a height of 150 microns, the height H2 of each channel 110d may 450 microns. Although FIG. 4 depicts three unitary electrical communication and spacer structures 101, 101', 101", the present disclosure is not limited to only this embodiment, as any number of unitary electrical communication and spacer structures 101, 101', 101" may be present in a column separating adjacently stacked active wafers from one another. For example, a column of unitary electrical communication and spacer structures may include 2, 3, 4, 5, 6, 7, 8, 9, 10, 15 or 20 spacer structures. In other embodiments, each channel 110d may have a height H2 ranging from 150 microns to 650 microns. In different embodiments, the height H2 may be at least 100 microns, 150 microns, 200 microns, 225 microns, 250 microns, 275 microns, 300 microns, 325 microns, 350 microns, 375 microns, 400 microns, 450 microns, 500 microns, 550 microns, 600 microns, 650 microns or 675 microns, or any range there between (e.g., 300 microns to 500 microns, or 350 microns to 550 microns).

Each of the unitary electrical communication and spacer structures 101, 101', 101" may be bonded to the adjacent unitary electrical communication and spacer structures 101, 101', 101" in the stacked column. For example, the electrically conductive core material 104 of each of the unitary electrical communication and spacer structures 101, 101', 101" in the stacked column may be bonded to the adjacent electrically conductive core material 104 of the adjacent unitary electrical communication and spacer structures 101, 101', 101" through a conductive bonded interface. For example, when the adjacent unitary electrical communication and spacer structures 101, 101', 101" are bonded to one another using methods employing solder bumps the electrically conductive interface between adjacent electrically conductive core material 104 may be provided by solder. The solder compositions described above for the seal structures 120 is suitable for the solder composition at the interface of adjoining ends of the electrically conductive core material 104 of each of the unitary electrical communication and spacer structures 101, 101', 101". The solder bump can provide an electrically conductive pad, e.g., metal pad, for adjoining ends of the electrically conductive core material 104 of each of the unitary electrical communication and spacer structures 101, 101', 101".

In some embodiments, the engagement at the base and upper surface of each column of a plurality of unitary electrical communication and spacer structures 101, 101', 101" includes a sealant structure 120 between the outer semiconductor layer 102 of the end unitary electrical communication and spacer structures 101, 101" and a non-conductive portion of the active wafers 112, 114. The sealant structure 120 has been described above with reference to FIGS. 1-3. In some embodiments, intermediary sealant structures 120' may be present between adjacent unitary electrical communication and spacer structures 101, 101', 101". The intermediary sealant structures 120' are similar to the sealant structures 120 at the ends of the columns of the plurality of unitary electrical communication and spacer structures 101, 101', 101" with the exception that the sealant structure engages two outer semiconductor layers 102 instead of engaging an outer semiconductor layer 102 to an active wafer. The sealant structures 120, 120' are typically employed when the coolant contained in the coolant passages 10d is non-dielectric. In some embodiments, e.g., when the coolant contained in the coolant passages 10d is dielectric coolant, the sealant structures 120, 120' may be omitted.

It is noted that the columns of the plurality of unitary electrical communication and spacer structures 101, 101', 101" that is depicted in FIG. 4 may be incorporated into the embodiments depicted in FIGS. 1-3.

Figure 5:
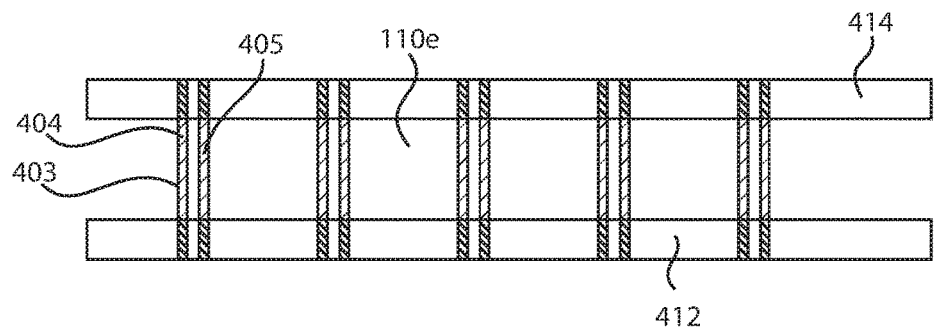
FIG. 5 is a side cross-sectional view of a single layer of an etched channel interconnect structure, in accordance with one embodiment of the present disclosure.

FIG. 5 shows two active 3D active wafers 412, 414 with unitary electrical communication and spacer structures 405 comprising and insulating material 403 and an electrically conductive core material 404. The active wafers 412, 414 depicted in FIG. 5 are similar to the active wafers 112, 114, 116, 118 that are described above with reference to FIGS. 1-4. The unitary electrical communication and spacer structures 405 are separate structure from the active wafers 412, 414, but are bonded to the wafers structures 412, 414 and provides electrical communication to the active wafers 412, 414 and/or through the active wafers 412, 414. The unitary electrical communication and spacer structure 405 also provides spacing between adjacently stacked active wafers, and in combination with the upper and lower surfaces of the active wafers 412, 414, provides coolant passages 110e for cooling the active wafers 412, 414, and devices present therein.

In the embodiment that is depicted in FIG. 5, the unitary electrical communication and spacer structures 405 are typically formed from a TSV structure formed through a sacrificial substrate, wherein the entirety of the sacrificial substrate material surrounding the TSV structure has been removed. Because the substrate material has been removed in its entirety, the unitary electrical communication and spacer structures 405 only comprises of the insulating material 403 and the electrically conductive core material 404. In some cases, the insulating material 403 may also be removed. This is one distinction from the structure depicted in FIG. 5 in comparison to the previous embodiments described above with reference to FIGS. 1-4, in which a portion of the sacrificial substrate remains to provide the outer semiconductor layers 102.

The coolant passages 110e depicted in FIG. 5 are typically used with a dielectric coolant and allows superior cooling of the interconnect structures, as well as the devices in the active wafers 412, 414. It is noted that multiple unitary electrical communication and spacer structures 405 may be employed in a column of stacked structures similar to the embodiment described above with reference to FIG. 4.

Figure 6A:
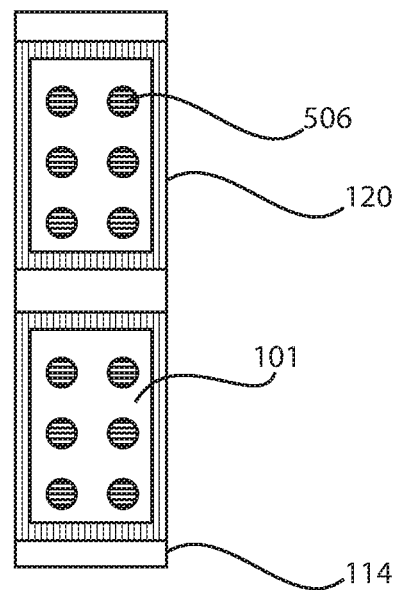
FIG. 6A is a top down view of the interface between an active wafer and a unitary electrical communication and spacer structure, wherein metal pads at the interface have a substantially circular geometry, in accordance with one embodiment of the present disclosure.

FIG. 6A is a top down view of a cross section along section line A-A of FIG. 1 of the interface between the unitary electrical communication and spacer structure 101 and the second active wafer 114. The first active wafer is identified by reference number 112 as being view from a top down perspective. The area between the unitary electrical communication and spacer structures 101 and atop the first active wafer 112 is the coolant passages 110. The coolant passages 110 are formed to direct coolant through the structure. The metal pads 506 and a coolant seal (sealant structure 120) connect the unitary electrical communication and spacer structures 101 to the second active wafer 114 (not shown in FIG. 6A). The metal pads 506 provide for electrical communication from the electrically conductive material core (not shown in FIG. 6A) of the unitary electrical communication and spacer structures 101 to the TSV structure 115 in the second active wafer 114. The coolant seal (sealant structure 120) isolates the metal interconnects (electrically conductive material core of the unitary electrical communication and spacer structures 101) when non-dielectric coolant is used. In one embodiment, the coolant seal can be both affixed to the wall/pin section, i.e., unitary electrical communication and spacer structures 10, and attached to the active die, i.e., second active wafer 114, using the same materials and by essentially the same process as the electrical (solder) interconnect process. The seal material could alternatively be added to either the wall/pin or active die by a separate deposition or patterning process of a separate material such as a polymer. This polymer could be cured either as part of the solder attach (reflow) process or with a separate cure step.

Since devices typically are provided with solder bumps for electrical contact, an option is to provide bumps that are small enough to be utilized with the handler adhesive in place. Another option at wafer level is to bump the active die on one side before attachment, then bump the other side of the active die once the handler has been removed.

Figure 6B:
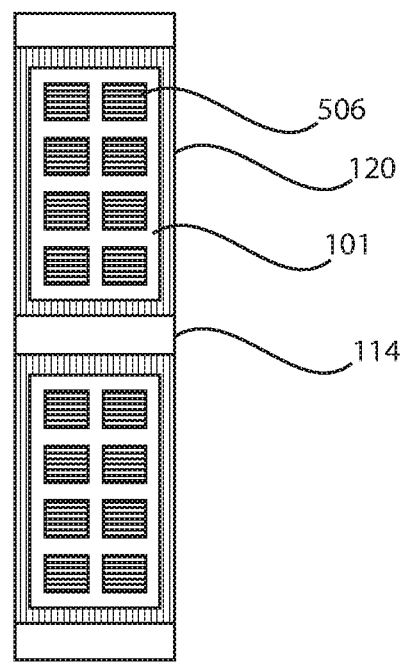
FIG. 6B is a top down view of another embodiment of the interface between an active wafer and a unitary electrical communication and spacer structure, wherein metal pads at the interface have a multi-sided geometry, in accordance with the present disclosure.

FIG. 6A depicts one embodiment of the interface between the unitary electrical communication and spacer structure 101 and the second active wafer 114 when the metal pads 506 have a substantially circular cross section. FIG. 6B depicts another embodiment of the interface between the unitary electrical communication and spacer structure 101 and the second active wafer 114. In the embodiment depicted in FIG. 6B, the rectangular, or potentially hexagonal geometry of the metal pads 506 provide for a high density and improved thermal behavior.

It is noted that the interface between the unitary electrical communication and spacer structure 101 and the second active wafer 114 is similar to the interface between the unitary electrical communication and spacer structure 101 and the first active wafer 112, or the interface between any of the unitary electrical communication and spacer structures disclosed herein and any of the active wafers.

Figure 7A:
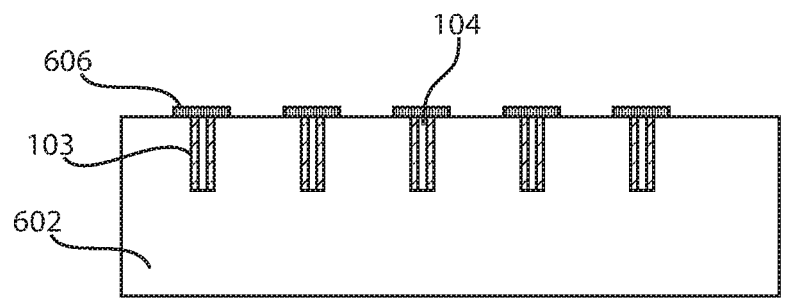
FIGS. 7A-7G illustrate one embodiment of a method of fabricating an electrical device, in accordance with the present disclosure.

One embodiment of a process flow to fabricate the structures of the present disclosure is illustrated in FIGS. 7A-7G. As shown in FIG. 7A, a first surface of a sacrificial substrate 602, e.g., silicon (Si) wafer, is patterned with a design to fabricate through-silicon vias (TSVs) and terminal metal pads by etching deep blind vias, insulating the vias with insulating material 103, filling the insulated vias with an electrically conductive material 104 and depositing metal terminals 606. The electrically conductive material 104 provides the electrically conductive core material 104 of the unitary electrical communication and spacer structure 101 depicted in FIG. 1. The insulating material 103 depicted in FIG. 7A provides the insulating material 103 of the unitary electrical communication and spacer structures 101 depicted in FIG. 1.

In some embodiments, the via openings through the sacrificial substrate 602 can be fabricated using a resist mask or a resist mask on dielectric hard mask (oxide or nitride). In the embodiments in which a hard mask is used, reactive ion etching (RIE) can be used to pattern the dielectric, after which the resist would be stripped. The next step would be to etch the through via openings in the sacrificial substrate 602. In some embodiments, the through via openings can be formed with a dry etch process called the Bosch process, which utilizes both $SF_6$ and $C_4F_8$ etch gasses alternately to create features with straight sidewalls. In some embodiments, the Bosh process forms the insulating material 103 on the sidewalls of the via opening as it is being formed through the sacrificial substrate 602. Other methods for forming the via openings through the sacrificial substrate 602 include wet etch methods with etchants, such as tetramethylammonium hydroxide (TMAH), potassium hydroxide (KOH), and hydrofluoric (HF)+nitric acid ($HNO_3$)+acetic acid. The choice of process is determined based on the feature sizes and shapes of the desired final TSV, which is processed to provide the unitary electrical communication and spacer structures 101. After the etching is completed, the sacrificial substrate 602 is stripped of any remaining resist and cleaned.

As described above, in some embodiments, the etch process, such as the Bosch etch process, that forms the via openings also forms the insulating material 103 that is formed on the etched surfaces of the sacrificial substrate 602 that provides insulating material 103 of the unitary electrical communication and spacer structures 101. In some other embodiments, following formation of the via openings, an insulating material 103 is formed on the sidewalls of the via openings provided by the etched surfaces of the sacrificial substrate 602. For example, the TSVs may be insulated with dielectric 103, which can be composed of plasma enhanced chemical vapor deposition (PECVD) oxide, PECVD nitride, thermal oxide (thermally grown oxide), low pressure chemical vapor deposition (LPCVD) nitride, etc.

In a following step, the via openings are then filled with the electrically conductive material 104. Popular metals for the electrically conductive material 104 that can be deposited within the via openings include copper (Cu) and tungsten (W). For example, copper (Cu) may be deposited to fill the via openings using electrodeposition, and tungsten (W) may be deposited to fill the via openings using chemical vapor deposition (CVD). Finally, the top surface of the sacrificial substrate 602 is planarized to remove any extra material that overfills the via opening. In some embodiments, at this point of the process flow, a terminal metal pad 606 is fabricated on top of the TSV to provide electrical connectivity to the outside. The terminal metals may be plated through a resist or deposited through a mask. Metallic materials that can be used for the thermal metal pad 606 may include Ni/Au, Cu/Ni/Au, etc.

Figure 7B:
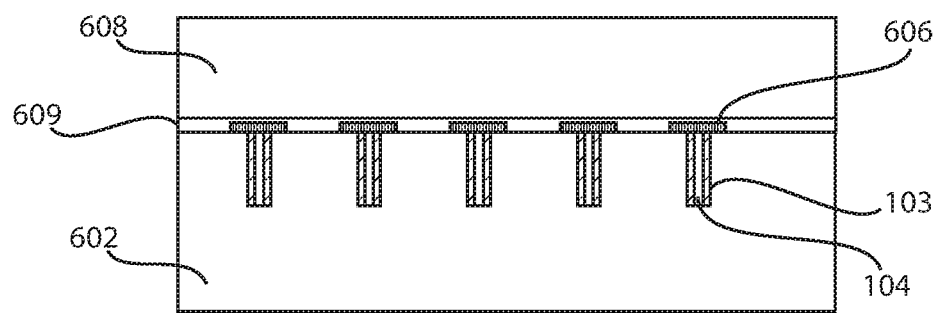

Following completion of TSV fabrication, the first surface of the sacrificial substrate 602 containing the terminal metal pad 606 is attached to a prepared glass handler 608 with bonding adhesive, as shown in FIG. 7B. This process of temporary wafer bonding utilizes a polymer adhesive 609 that can adequately adhere the two interfaces together until a later time when the glass handler 608 is removed. Time, temperature and pressure are used to provide a good bond between the glass handler 608 and the sacrificial substrate 602.

Figure 7C:
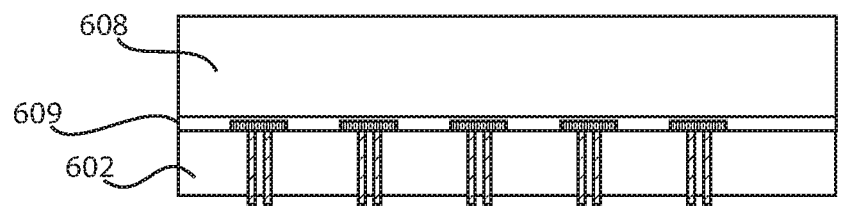

Referring to FIG. 7C, the stacked structure including the sacrificial substrate 602, the adhesive 609, and the glass handler 608 is then processed using a grinding process to remove the majority of the substrate material from the exposed surface of the sacrificial substrate 602. The grinding process may include chemical mechanical planarization (CMP). The grinding process is applied to the exposed surface of the sacrificial substrate 602 to come within a desired distance from the bottom of the blind TSVs. For example, the grinding process may be continued until the distance from the ground surface of the sacrificial substrate 602 and the bottom of the blind TSV structure ranges from 5 microns to 10 microns. The TSVs are then revealed through a known process, for example the process described in U.S. Pat. No. 8,487,425, entitled "Optimized annular copper TSV", the contents of which are incorporated by reference herein. For example, a selective etch process may be employed to expose the base surfaces of the blind TSV structures. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater, e.g., 1000:1. In the present example, the selective etch process may include an etch chemistry that removes the material of the sacrificial substrate selectively to the insulating material 103 and the electrically conductive material 104 of the TSV structure.

Figure 7D:
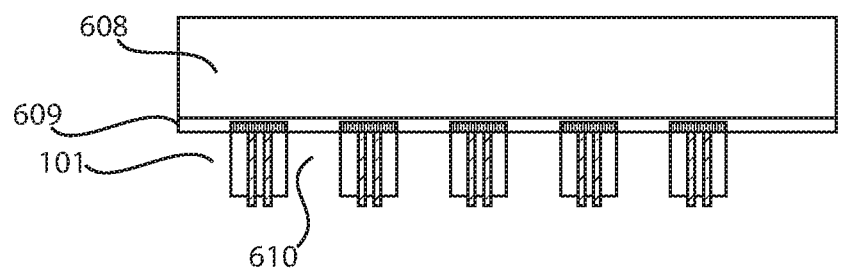

Referring to FIG. 7D, channels 610 may then be etched into the sacrificial substrate 602. For example, using a front-to-back alignment system, a resist mask may be used to pattern channels on the exposed surface, i.e., backside surface, of the bonded stack including the sacrificial substrate 602. In some embodiments, deep reactive ion etching (DRIE) may be used to etch channels 610 in the sacrificial substrate 602, stopping at the adhesive layer 609 without over-etching or damaging the semiconductor material surrounding the TSVs. The remaining portion 102 of the semiconductor material that is positioned adjacent to the TSV structure following forming the channels 610 of the sacrificial substrate 602 provides the semiconductor outer layer 102 of the unitary electrical communication and spacer structure 101. An alternative method of achieving the structure depicted in FIG. 7D is to stick the bonded structures into a bath of TMAH. The time for submersion and concentration of TMAH in the process is selected to ensure enough that some semiconductor material from the sacrificial substrate 602 is left remaining around the TSVs and yet enough of the sacrificial substrate is removed so that the channels 610 extend to the adhesive layer 609. The remaining portion of sacrificial material 102, the insulating material 103 and the electrically conductive material 104 provide the unitary electrical communication and spacer structure 101. The plurality of unitary electrical communication and spacer structures 101 that remain attached to the glass handler 608 through the adhesive layer 609 at this stage of the process sequence may be referred to as a semiconductor channel structure. Note here particularly that even if the process to this point has been conducted on a large area glass handler with sacrificial substrate, that structure may be subdivided into smaller sections (often referred to as die) for the processing that follows or the processing that follows may be conducted on the original large area basis. If smaller sections are used they may be processed in conjunction with large or small active wafers in processes often referred to as "wafer on wafer", "die on wafer" or "die on die"

Figure 7E:
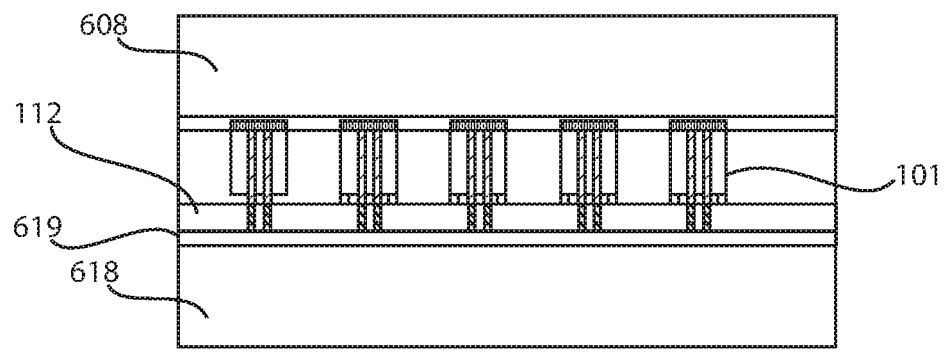

Referring to FIG. 7E, in a following process step, the structure depicted in FIG. 7D is bonded to a first active wafer 112, i.e., device wafer, that itself has been temporarily bonded to its own glass handler 618 with an adhesive layer 619. The first active wafer 112 has been described above with reference to FIG. 1. Referring to FIG. 7E, the bonding of the semiconductor channel structure to the first active wafer 112 can be achieved through a variety of solders and metals, e.g., via solder bump processing. In some embodiments, the bonding material can act as a sealant structure 120, or a separate step can be undertaken to deposit a sealant structure 120 between the semiconductor channel structure and the first active wafer 112. If the sealant structure is composed of solder, rather than a polymer, areas of the seal sections must be limited to avoid solder pooling during attach/reflow.

As indicated above, the sealant structures 120 may be omitted in the embodiments of the present disclosure that employ a dielectric coolant as the coolant media. Further, in some embodiments, the remaining portion 102 of sacrificial substrate material may also be omitted in the embodiments of the present disclosure that employ a dielectric coolant as the coolant media. The remaining portion 102 of the sacrificial substrate material may be removed by a selective etch process, which removes the sacrificial substrate material selectively to the insulating material 103 and the electrically conductive material 104 of the TSV structure. In the embodiments that remove the remaining portion 102 of the sacrificial substrate material, the unitary electrical communication and spacer structures 101 are composed of only the electrically conductive material core 104 and insulating material 103 as depicted in FIG. 5.

As described above with reference to FIG. 3, it may be desirable to etch the first active wafer 112 in the non-active areas of the device wafer to less than full depth for fluid control structures, i.e., trenches to increase the height H2 of the coolant passages, as depicted in FIG. 3. Such processing can be achieved using photolithography and etch processing.

Figure 7F:
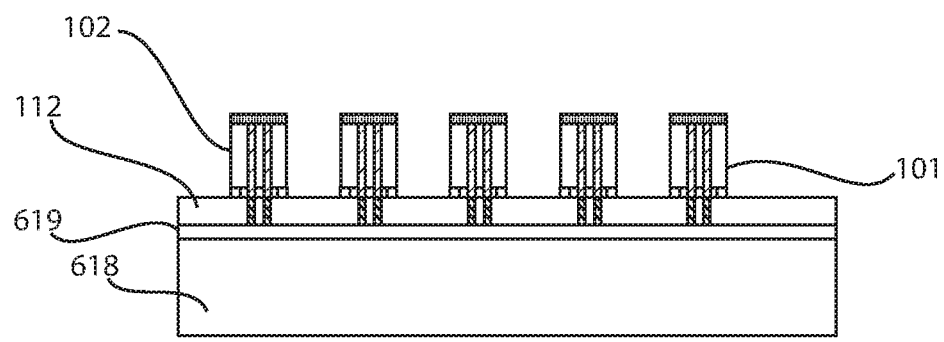
Figure 7G:
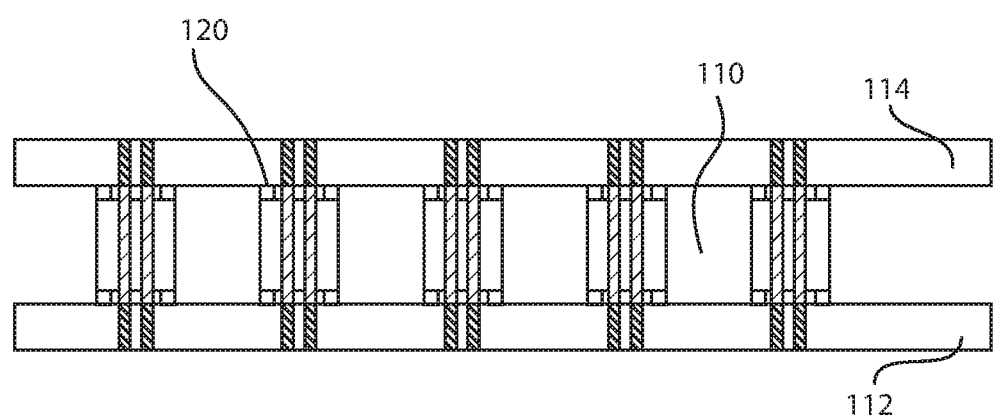

Referring to FIG. 7F, the glass handler 608 and the adhesive layer 609 are then removed from the structure depicted in FIG. 7E. In some embodiments, the glass handler 608 supporting the silicon channel structure can be removed through laser ablation or other appropriate technique. Removing the glass handler 608 and the adhesive layer 609 exposes the surfaces of the electrically conductive material 104 opposite the surfaces of the electrically conductive material 104 that are bonded to the first active wafer 114. The remaining portion 102 of sacrificial substrate material, the insulating material 103 and the electrically conductive material 104 collectively provide the unitary electrical communication and spacer structures 101.

In some embodiments, another active device wafer, e.g., second active wafer 114, can then be aligned and bonded to the tops of the silicon channel structure of FIG. 7F to complete a "single layer" structure as illustrated in FIG. 1. The bonding can be provided by solder, using a solder bump process. Optional sealant structure 120 may also be formed between the unitary electrical communication and spacer structures 101 and the second active wafer 114, which are similar to the sealant structure 120 that have been described above at the interface of the unitary electrical communication and spacers structure 101 and the first active wafer 112. In some embodiments, bonding may include a polymeric material as an adhesive, which can serve as an alternative to solder.

Coolant passages 110 are formed between the unitary electrical communication and spacer structures 101 and the active wafers, e.g., first and second active wafers 112, 114. The coolants passages 110 may allow for dielectric or non-dielectric to be passed through the passages to cool the devices within the active wafers, e.g., first and second active wafers 112, 114, and/or to cool the electrical interconnects, such as the electrically conductive core material 104 of the unitary electrical communication and spacer structures 101. The coolant may be a non-dielectric coolant, such as water, or may be a dielectric coolant. As discussed above, when employing a dielectric coolant, the sealant structures 120 and the semiconductor outer layer 102 of the unitary electrical communication and spacer structures 101 may be omitted.

It is not necessary that only a single row of unitary electrical communication and spacer structures 101 be present between the active wafers 112, 114, because any number of spacer structures 101 may be stacked in a column type geometry, as depicted in FIG. 4. To provide a column of a plurality of stacked unitary electrical communication and spacer structures 101, instead of bonding an active wafer to the exposed upper surfaces of the unitary electrical communication and spacer structures 101 that are depicted in FIG. 7F, another semiconductor channel structure, as depicted in FIG. 7D, is bonded to the exposed upper surfaces of the unitary electrical communication and spacers structures 101. The engagement of adjacently stacked unitary electrical communication and spacers structures 101 may be provided by bonding, e.g., through a solder bump process. The bonding may also be provided using polymeric materials. Following bonding of the adjacently stacked unitary electrical communication and spacers structures 101, the glass handler 608 and the adhesive layer 609 may be removed, as described with reference to FIG. 7F. Thereafter, an active wafer may be bonded to the adjacently stacked unitary electrical communication and spacers structures 101, or another row unitary electrical communication and spacers structures 101 may be added until the desired height for the column of the plurality of stacked unitary electrical communication and spacer structures 101 has been reached.

The process sequence that has been described above with reference to FIGS. 7A to 7G can be repeated to fabricate the multi-layer structure illustrated in FIGS. 2 and 3. The fabrication process can be repeated many times if the interconnect bond is constructed to be permanent (i.e., resistant to the process that creates the next layer bond) or stable enough to tolerate the next attach step. This could be, for example, a cured polymer component or an intermetallic-only bond. The resulting coolant passages 110 would be large enough to support either single or two-phase coolant flow. The assembled interconnect structure and active die stack will have coolant brought to an area between active dies defined as an inlet area (generally, but not necessarily, one edge of the die stack) and removed from an area defined as the outlet area (generally, but not necessarily, the opposite edge of the die stack) by a manifolding structure according an number of methods well known in the art for bringing coolant into and out of a multiple semiconductor die stack.

The spacer structure may be built utilizing a completely different process flow/technology relative to the active dies, allowing, for example, deep tungsten TSV's. Thus, the spacer could be two or three times thicker than the active dies. The approach allows for large channels while preserving substantial numbers of fine pitch interconnects. It is potentially extendible to arbitrarily high die stacks presuming power can be delivered (on die voltage translation/regulation). It can be utilized not only with more conventional parallel channel single-phase or two-phase cooling but also with more innovative radial two-phase channels.

The present disclosure allows for within-stack cooling with no back-side etching of channels into the active dies. However, back-side etching can be employed if larger channels are desired or if it is desirable to provide coolant closer to the active elements, as shown in FIG. 3. Coolant can flow directly on both sides of interior active dies with access to thermally conductive wall structures for additional heat transfer.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for forming an electrical device comprising:
creating a plurality of columns of unitary electrical communication and spacer structures including an electrically conductive core material attached to a handler structure, the electrically conductive core material being the only metal layer of the unitary electrical communication and spacer structures, wherein an air gap is present separating adjacently positioned columns of unitary electrical communication and spacer structures of said plurality of columns;
attaching first ends of the plurality of columns to a first active wafer;
releasing the handler structure from the columns; and
attaching at least one second active wafer to second ends of the plurality of columns, wherein a dielectric epoxy based sealant is between the second active wafer and an outer layer of the plurality of columns of unitary electrical communication and spacer structures so that the dielectric epoxy based sealant is in direct contact with both the second active wafer and the outer layer of the plurality of columns of unitary electrical communication and spacer structures, wherein coolant passages housing liquid coolant are formed between the plurality of columns and the first active wafer and the at least one second active wafer, and the plurality of columns of unitary electrical communication and spacer structures further comprising semiconductor material sidewalls having a substantially conformal width that is substantially the same for each of the plurality of unitary electrical communication and spacer structures that is encircling the electrically conductive material core, and a solid dielectric layer having a substantially same width as a diameter of the electrically conductive material core between and in direct contact with both the electrically conductive material core and the semiconductor material sidewalls, the at least one unitary electrical communication and spacer structure being separate from and engaged to the adjacently stacked first and second active wafers.

2. The method of claim 1, further comprising:
creating at least one other set of a plurality of columns of unitary electrical communication and spacer structures including an electrically conductive core material attached to another handler structure.

3. The method of claim 2, further comprising:
attaching first ends of the at least one other set of the plurality of columns to a first active wafer;
releasing said another handler structure from the at least one other set of the plurality of columns; and
attaching at least one other active wafer to second ends of the at least one other set of plurality of columns, whereby another set of coolant passages are formed between the at least one other set of the plurality of columns and the second active wafer and said at least one other active wafer.

4. The method of claim 1, wherein creating the plurality of columns of unitary electrical communication and spacer structures comprises forming a plurality of through silicon via (TSV) structures in a sacrificial substrate; and removing material from the sacrificial substrate between adjacent TSV structures in the plurality of TSV structures.

5. The method of claim 4, wherein at least one of the plurality of columns of unitary electrical communication and spacer structures comprises a plurality of unitary electrical communication and spacer structures.

6. The method of claim 5, wherein each of the unitary electrical communication and spacer structures includes a substrate material outer layer, wherein the substrate material outer layer is a remaining portion of the sacrificial substrate.

7. The method of claim 1, wherein the liquid coolant is a dielectric or non-dielectric coolant.

8. The method of claim 1, wherein the electrically conductive core material is formed to electrically communicate with at least one through silicon via structure in a wafer.

9. The method of claim 8, wherein the at least one through silicon via structure connects to a set of adjacently stacked active wafers.

10. A method for forming an electrical device comprising:
creating a plurality of columns of unitary electrical communication and spacer structures including an electrically conductive core material attached to a handler structure, the electrically conductive core material being the only metal layer of the unitary electrical communication and spacer structures, wherein an air gap is present separating adjacently positioned columns of unitary electrical communication and spacer structures of said plurality of columns;
attaching first ends of the plurality of columns to a first active wafer;
releasing the handler structure from the columns;
attaching at least one second active wafer to second ends of the plurality of columns, wherein coolant passages housing liquid coolant are formed between the plurality of columns and the first active wafer and the at least one second active wafer, wherein a dielectric epoxy based sealant is between the second active wafer and an outer layer of the plurality of columns of unitary electrical communication and spacer structures so that the dielectric epoxy based sealant is in direct contact with both the second active wafer and the outer layer of the plurality of columns of unitary electrical communication and spacer structures, and the plurality of columns of unitary electrical communication and spacer structures further comprising semiconductor material sidewalls having a substantially conformal width that is substantially the same for each of the plurality of unitary electrical communication and spacer structures that is encircling the electrically conductive material core, and a solid dielectric layer having a substantially same width as a diameter of the electrically conductive material core between and in direct contact with both the electrically conductive material core and the semiconductor material sidewalls, the at least one unitary electrical communication and spacer structure being separate from and engaged to the adjacently stacked first and second active wafers; and
creating at least one other set of a plurality of columns of unitary electrical communication and spacer structures including an electrically conductive core material attached to another handler structure.

11. The method of claim 10, further comprising:
attaching first ends of the at least one other set of the plurality of columns to a first active wafer;
releasing said another handler structure from the at least one other set of the plurality of columns; and
attaching at least one other active wafer to second ends of the at least one other set of plurality of columns, whereby another set of coolant passages are formed between the at least one other set of the plurality of columns and the second active wafer and said at least one other active wafer.

12. The method of claim 10, wherein creating the plurality of columns of unitary electrical communication and spacer structures comprises forming a plurality of through silicon via (TSV) structures in a sacrificial substrate; and removing material from the sacrificial substrate between adjacent TSV structures in the plurality of TSV structures.

13. The method of claim 12, wherein each of the unitary electrical communication and spacer structures includes a substrate material outer layer, wherein the substrate material outer layer is a remaining portion of the sacrificial substrate.

14. The method of claim 10, wherein attaching the first ends of the plurality of columns to the first active wafer comprises bonding through a solder or polymeric material.

15. The method of claim 10, wherein attaching the at least one second active wafer to second ends of the plurality of columns comprises bonding through a solder or polymeric material.

16. The method of claim 10, wherein the liquid coolant is a dielectric or non-dielectric coolant.

17. The method of claim 16, wherein at least one through silicon via structure connects to a set of adjacently stacked active wafers.

18. The method of claim 10, wherein the electrically conductive core material is formed to electrically communicate with at least one through silicon via structure in a wafer.

* * * * *